United States Patent
Inoue et al.

(10) Patent No.: US 6,309,515 B1
(45) Date of Patent: *Oct. 30, 2001

(54) SPUTTERING APPARATUS FOR SPUTTERING HIGH MELTING POINT METAL AND METHOD FOR MANUFACTURING SEMICONDUCTOR DEVICE HAVING HIGH MELTING POINT METAL

(75) Inventors: Ken Inoue; Hitoshi Abiko; Minoru Higuchi, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,649

(22) Filed: Oct. 29, 1998

(30) Foreign Application Priority Data

Oct. 29, 1997 (JP) ................................... 9-297022

(51) Int. Cl.$^7$ ........................... C23C 14/34; H01L 21/44
(52) U.S. Cl. .............................. 204/192.15; 204/192.25; 438/592; 438/649; 438/682
(58) Field of Search .................. 204/192.12, 192.15, 204/192.2, 192.17, 192.25, 298.11, 298.15; 438/592, 649, 682

(56) References Cited

U.S. PATENT DOCUMENTS

| | | |
|---|---|---|
| 4,908,331 | 3/1990 | Raaijmakers .................. 437/187 |
| 5,409,587 * | 4/1995 | Sandhu et al. .................. 204/298.11 |
| 5,439,574 * | 8/1995 | Kobayashi et al. ............ 204/298.15 |
| 5,584,973 * | 12/1996 | Wada et al. .................... 204/298.11 |
| 5,624,536 * | 4/1997 | Wada et al. .................... 204/298.11 |
| 5,643,428 * | 7/1997 | Krivokapic et al. ........... 204/298.11 |
| 5,705,042 * | 1/1998 | Leiphart et al. ............... 204/298.11 |
| 5,728,276 * | 3/1998 | Katsuki et al. ................. 204/298.11 |
| 5,783,282 * | 7/1998 | Leiphart ......................... 204/192.17 |

FOREIGN PATENT DOCUMENTS

| | | |
|---|---|---|
| 61-221363 | 10/1986 | (JP) . |
| 62-70430 | 5/1987 | (JP) . |
| 62-195109 | 8/1987 | (JP) . |
| 63-247364 | 10/1988 | (JP) . |
| 63-262462 | 10/1988 | (JP) . |
| 2-45923 | 2/1990 | (JP) . |
| 3-170668 | 7/1991 | (JP) . |
| 5-136058 | 6/1993 | (JP) . |
| 7-316806 | 12/1995 | (JP) . |
| 8-69996 | 3/1996 | (JP) . |
| 9-272973 | 10/1997 | (JP) . |

\* cited by examiner

*Primary Examiner*—Nam Nguyen
*Assistant Examiner*—Gregg Cantelmo
(74) *Attorney, Agent, or Firm*—Foley & Lardner

(57) ABSTRACT

There is provided a method for manufacturing a semiconductor device for forming a silicide layer of metal of high melting point, wherein the metal of high melting point is processed in sputtering under a condition in which no deterioration is produced by the sputtering apparatus. There is also provided a sputtering apparatus for manufacturing semiconductor device. In the method of the present invention, a high melting point metal is accumulated on a silicon substrate formed with a gate electrode of a semiconductor element to form a metallic film of high melting point, thereafter it is heat treated to form a silicide layer of the high melting point metal at an interface layer with the metallic film with high melting point, and in this case, the metallic film of high melting point is accumulated in sputtering by a magnetron sputtering device under a condition in which an electrical load amount Q reaching to the gate electrode is less than 5 C/cm$^2$. In addition, the sputtering apparatus 30 has the collimator plate 32 including an electrical conductive material having many through-pass holes passed from the target toward the wafer between the target holder 16 and the wafer holder 14 while it is being connected to an earth terminal.

19 Claims, 18 Drawing Sheets

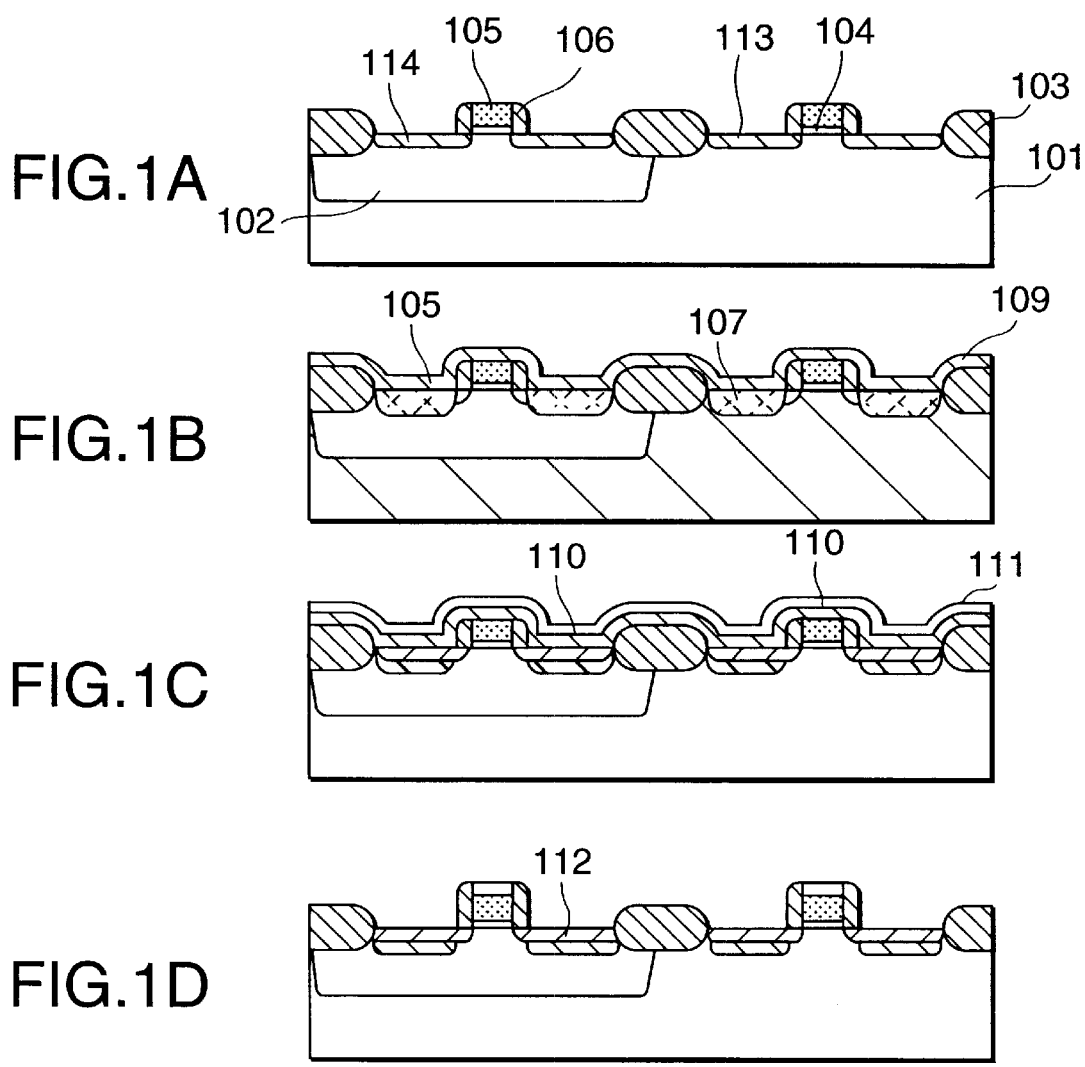

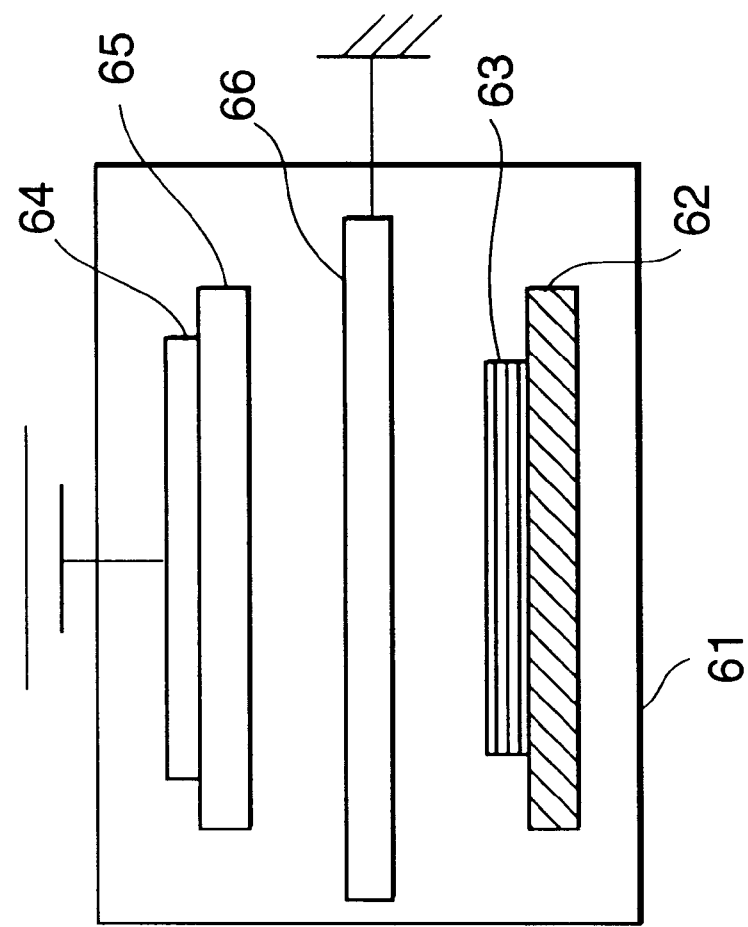
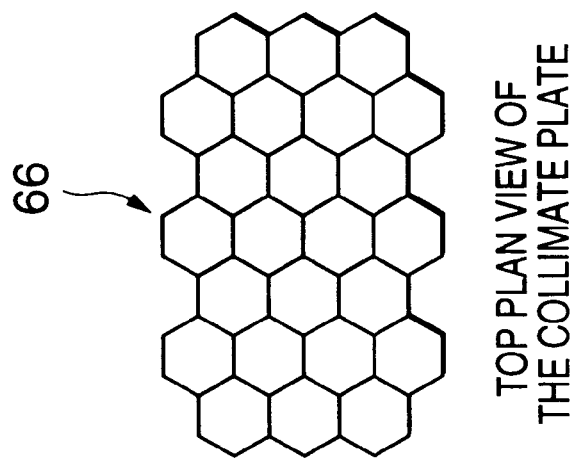
FIG. 6A
FIG. 6B
TOP PLAN VIEW OF THE COLLIMATE PLATE

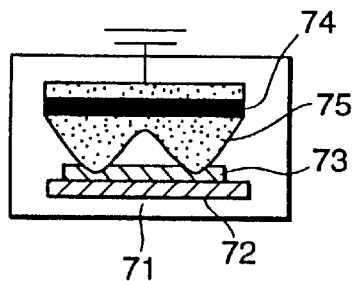

FIG. 7A
PRIOR ART 1
(IN THE CASE THAT
NO HOLDER
MAGNET IS PRESENT)

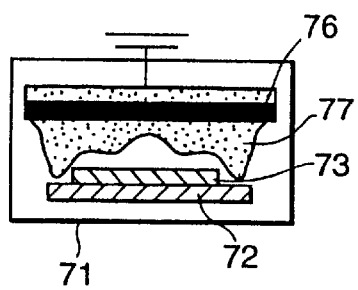

FIG. 7B

A SIZE OF TARGET IS
SET IN SUCH A WAY THAT
A REGION
HAVING A MAXIMUM

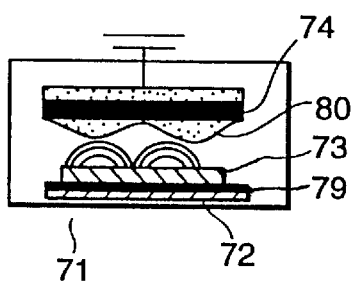

FIG. 7C
PRIOR ART 2
(IN THE CASE THAT PLASMA IS
NOT CONTACTED WITH THE
WAFER AND THE HOLDER
MAGNET IS PRESENT)

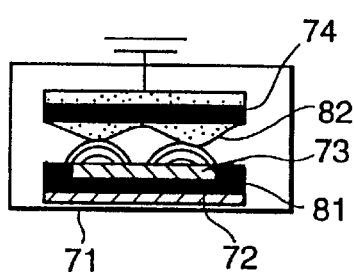

FIG. 7D

THE HOLDER MAGNET
COVERS THE WAFER
(THE PRESENT INVENTION)

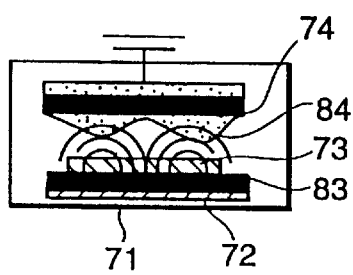

FIG. 7E

REGION WHERE A STRENGTH OF
THE HOLDER MAGNET IS
THE MAXIMUM PLASMA
DENSITY IS POSITIONED ABOVE
THE WAFER
(THE PRESENT INVENTION)

NO COLLIMATOR

L1(39mm)L2(113mm)
2.0kw

L1(39mm)L2(113mm)
1.5kw

L1(39mm)L2(113mm)
1.0kw

SPUTTERING APPARATUS FOR SPUTTERING HIGH MELTING POINT METAL AND METHOD FOR MANUFACTURING SEMICONDUCTOR DEVICE HAVING HIGH MELTING POINT METAL

BACKGROUND OF THE INVENTION

1. Field of the Invention

This invention relates to a sputtering apparatus for sputtering a high melting point metal, and more particularly a method for manufacturing a MOS type field effect transistor (MOSFET) producing a low resistance by making a silicide of each of the surfaces of the gate, source and drain surfaces in a self-coincidence manner. In addition, the present invention relates to a sputtering apparatus in which metal with high melting point can be sputtered on a poly-crystalline-silicon film in such a way that an insulating withstand voltage deterioration in a gate oxidation film may not be produced when a high melting point metallic silicide which is constitutive of metal with high melting point film is formed at a gate electrode.

2. Description of the Prior Art

As the prior art silicide process known as one of the methods for manufacturing semiconductor device, there is provided a method disclosed in Japanese Patent Application No. Hei 2-45923. Referring now to longitudinal sections of FIGS. 3A to 3D in an order of steps, this prior art method for manufacturing the semiconductor device will be described.

As shown in FIG. 3A, an N-well 302 is formed at a P-type silicon substrate 301 by a well-known method. Then, a field oxidation film 303 is formed as a field insulating film at the surface of the P-type silicon substrate 301 by a selective oxidation process. A gate insulating film 304 such as a silicon oxidation film or the like and a poly-crystalline silicon are grown in an active region enclosed by this field oxidation film 303, phosphorus is doped by a well-known process to reduce an electrical resistance of the poly-crystalline silicon. Then, the poly-crystalline silicon is processed with patterning to form a gate electrode 305 by well-known processes of a photo-lithography and a dry etching.

Then, an N-type impurities dispersion layer 313 of low concentration and a P-type impurities dispersion layer 314 of low concentration are formed by the photo-lithography and an ion implanting process as shown in FIG. 3A. Then, a side wall (a spacer) 306 constituted by a silicon oxidation film or silicon nitride film is formed at a side surface of the gate electrode 305 by a well-known chemical vapour development (CVD) technology and an etching technology.

Then, an N-type impurities dispersion layer 307 and a P-type impurities dispersion layer 308 are formed by the photo-lithography and the ion implanting process as shown in FIG. 3B. In this way, as an LDD structure, an N-type source drain region 307 and a P-type source drain region 308 are formed. Then, natural oxidation film at the surface of the poly-crystalline silicon and the surface of the semiconductor substrate is removed, for example, a titanium film 309 is accumulated in sputtering process.

Then, as shown in FIG. 3C, a fast heat treatment (hereinafter called as RTA) at 700° C. under nitrogen atmosphere is carried out, thereby only the titanium film 309 contacted with silicon is changed into silicide so as to form a titanium silicide layer 310 of C49 type structure. In addition, in this case, the titanium film 309 contacted with the field oxidation film 303 and the spacer 306 and a part of the titanium film on the semiconductor substrate are nitrided to become a titanium nitride film 311.

Then, as shown in FIG. 3D, it is processed selectively with wet etching by mixture solution such as ammonia solution and hydrogen peroxide solution and the like so as to remove only not-yet reacted titanium and the titanium nitride film 311. Then, RTA at a higher temperature (800° C. or more) than the aforesaid RTA is carried out to form a titanium silicide layer 312 of C54 type structure having a lower electric resistibility than that of the aforesaid titanium silicide layer 310 of C49 type structure.

Application of the aforesaid silicide process causes the surfaces of the poly-crystalline silicon 305, N-type and P-type impurities dispersion layers 307, 308 to be changed into silicide in a self-alignment manner and to have a low resistance and then a high speed in operation of the device can be attained. This silicide forming process has an advantage in which only the required region can be selectively reached to silicide.

In this case, a magnetron sputtering apparatus 10 (of FIG. 8) shown in the prior art is in general provided with a wafer holder 14 for use in mounting a wafer W within a sputter chamber 12 and a cathode magnet 16 for holding a target T at a position spaced apart and oppositely faced against the wafer W as shown in FIG. 8.

In the case that Co was sputtered on a polycrystalline-silicon gate electrode, for example, under application of the prior art magnetron sputtering apparatus 10 (of FIG. 8) to form a Co silicide electrode, the chip having poor electric insulation state at the gate oxidation film was generated on the wafer, a large amount of chips were produced around the wafer in particular, resulting in that a certain problem occurred in view of improving yield of product.

This paragraph shows a test result performed under an application of the prior art magnetron sputtering apparatus 10 (of FIG. 8) wherein Co was sputtered on poly-crystalline-silicon of the gate electrode in the following sputtering condition to form a Co film, then RTA was applied to make a Co silicide, thereafter a state of insulating withstand voltage at the gate oxidization film was tested for every chip of wafer.

In this test, the prior art magnetron sputtering apparatus 10 is applied, Co is sputtered on the poly-crystalline-silicon film 22 of the gate electrode formed on the silicon substrate 20 to form a Co film 24 and then RTA is applied to form a Co silicide layer as shown in FIG. 9. FIG. 9 shows a state in which the Co film 24 is formed on the polycrystalline-silicon film 22 of the gate electrode by a sputtering process. In FIG. 9, reference numeral 26 denotes a spacer and reference numeral 28 denotes a gate oxidation film.

Sputtering Condition
    Chamber pressure: 5 to 15 mTorr
    Gas flow rate: Ar/50 to 100 scc/m
    Sputtering power: 1.5 kW However, the Co sputtering under application of the prior art magnetron sputtering apparatus 10 showed that a poor insulation was produced at the gate oxidation film of the chip at a peripheral part of the wafer as shown in FIG. 11, a percentage of a superior chip having an insulating withstand voltage of the gate oxidation film more than a predetermined value in respect to entire chips of the wafer, a so-called yield rate was about 46% as indicated by combined results of the example of experiment 1 and the example of experiment 2 in FIG. 19.

In FIG. 11, the chip having a high degree of poor insulation at the gate oxidation film is colored in black and the chip having a low degree of poor insulation is colored in gray (no such regions shown in FIG. 11).

However, the aforesaid prior art method for manufacturing a semiconductor device has a problem that after forming a gate polycrystalline-silicon, a high melting point metal is sputtered and accumulated on the gate polycrystalline-silicon, resulting in that the gate electrode 305 is charged up by an electrical load generated from plasma and then the gate withstand voltage becomes deteriorated.

As a method for forming silicide only on the gate electrode and the dispersion layer, although this method is an effective one in view of silicide formation process, the ground structure applied when the metal with high melting point is sputtered is set such that a natural oxidation film at the surface of the gate electrode 305 is removed, the gate electrode 305 is already doped with impurities, resulting in that it becomes a floating gate.

Due to this fact, it may produce a problem that a shutter is opened during a sputtering, in particular during sputtering electrical discharging or an electrical discharging at the time of waiting and an electrical load is produced at the gate electrode immediately after the sputtering accumulation on the wafer is started, the electrical load is flowed in the gate insulating film 304 to cause a gate withstand voltage to be deteriorated. This phenomenon is made remarkable as a film thickness of the gate insulating film 304 is made thin or the gate insulating film is highly integrated and as its fine formation is promoted, whereby it becomes a serious problem.

SUMMARY OF THE INVENTION

In view of the foregoing, the present invention has been accomplished and it is an object of the present invention to provide a method for manufacturing a semiconductor device in which a metallic silicide layer of high melting point is formed between the insulating films selectively formed on the semiconductor substrate, wherein the metal with high melting point is sputtered under a condition in which a gate withstand voltage caused by the sputtering apparatus is not deteriorated.

In addition, it is another object of the present invention to provide a method for manufacturing a semiconductor device capable of manufacturing a MOS type field effect transistor having a high reliability and a low resistance.

In addition, as already described above, there was a problem that an insulating characteristic of the gate oxidation film is decreased when the metals with high melting point such as Co, Ti, Ni and W or the like are sputtered on the poly-crystalline-silicon film under application of the prior art magnetron sputtering apparatus.

In view of the foregoing, it is a still further object of the present invention to provide a sputtering apparatus in which metal with high melting point can be sputtered on the poly-crystalline silicon film in such a way that an insulating withstand voltage of the gate oxidation film is not deteriorated when a silicide film of metal with high melting point is formed at the gate electrode.

In order to accomplish the aforesaid objects, the present invention provides a method for manufacturing a semiconductor device in which a metal with high melting point is accumulated on an entire surface of a silicon substrate formed with a gate electrode of semiconductor element to form a metal film with high melting point, thereafter it is heat treated to form a silicide layer of metal with high melting point at an interface layer between it and the film of metal of high melting point, wherein the film of metal of high melting point is sputtered and accumulated by a magnetron sputtering device under a condition in which an amount of electrical load Q reaching the gate electrode is less than 5 $C/cm^2$.

In view of the foregoing, the aforesaid magnetron sputtering device has a constitution in which a size of the target is set and metal of high melting point is sputtered and accumulated in such a way that an area having a maximum density of plasma may be placed outside the silicon substrate.

Additionally, the aforesaid magnetron sputtering apparatus may be constructed such that the metal with high melting point is sputtered and accumulated under a state in which a holder magnet at the silicon substrate covers the side surface of the wafer having the silicon substrate and a strength of the holder magnet at the wafer may be set to sputter and accumulate the metal with high melting point in such a way that the region having the maximum plasma density may be placed above the wafer having the silicon substrate.

In addition, the aforesaid magnetron sputtering apparatus may be constituted such that metal with high melting point is sputtered and accumulated under a state in which a collimator plate of electrical conductor is inserted in a space between the target and the wafer having the silicon substrate. In addition, it is desirable that the aforesaid metal with high melting point is one of metals such as titanium, cobalt and nickel.

In the present invention, the metal with high melting point is sputtered and accumulated under a condition in which an amount of electrical load Q reaching the gate electrode is less than 5 $C/cm^2$ and then a deterioration of gate withstand voltage is not produced.

This action will be described as follows. FIG. 4 indicates a yield rate at a gate withstand voltage of a wafer in which after a native oxidation film is etched with fluoric acid, titanium is sputtered and accumulated and then the accumulated titanium is wet etched with mixture solution of ammonia water and a solution of hydrogen perioxide without performing any heat treatment. As an example of comparison, the item measured without performing any sputtering action is also indicated.

In the case that titanium is processed with sputtering and immediately etched by the aforesaid etching solution, an initial inferior withstand voltage in gate is generated and the gate withstand voltage is substantially deteriorated during sputtering operation, resulting in that the gate yield rate in this case shows a lower yield rate as compared with a gate yield rate II in the case that titanium is not processed with sputtering as indicated by I in FIG. 4.

FIG. 5 indicates a yield rate of gate withstand voltage in the case that the collimator plate is inserted between the wafer and the target when the sputtering accumulation is carried out under a comparison between a yield rate of gate withstand voltage when the collimator plate is not inserted and sputtering accumulation is carried out and a yield rate of gate withstand voltage under no sputtering accumulation. Also in this case, the wet etching is carried out without performing any heat treatment after sputtering in the same manner as that shown in FIG. 4 and measurement is performed.

It is apparent that a yield rate of gate withstand voltage in the case that a collimator plate is inserted between the wafer and the target when the sputtering accumulation is carried out is similarly 100% in the same manner as that of a yield rate V of withstand voltage when the sputtering accumulation is not carried out as indicated by IV in FIG. 5 and no deterioration of gate withstand voltage caused by sputtering occurs as compared with a yield rate of gate withstand voltage in the case that titanium is processed with sputtering and immediately after this operation it is processed with wet etching as indicated by III in FIG. 5 and then a superior gate withstand voltage can be attained.

In this case, since the collimator plate is inserted between the wafer and the target, an electrical load which may be reached to the wafer is flowed in the collimator plate, resulting in that a charging-up of the gate electrode is restricted and a sputtering accumulation can be carried out in such a way that the amount of electrical load Q reaching the gate electrode may become less than 5 $C/cm^2$.

The collimator sputtering unit is usually applied for performing an accumulation of titanium at the bottom part of a contact hole in a well-anisotropic manner and improving a coverage of the sputtering film. However, in this case, it is satisfactory that the existing collimator plate is not used and a net-like plate, for example, which is electrically connected to a ground terminal is inserted between the wafer and the target, resulting in that a similar result to that attained under application of the collimator sputtering unit can be provided.

As described above, in the case that metal with high melting point is sputtered and accumulated on the floating gate electrode having a silicide structure, it may be applicable that as a method for controlling an amount of electrical load reaching to the wafer, useless amount of electrical load is not produced from plasma or the generated electrical load is not reached to the wafer. Due to this fact, it is possible to improve a gate withstand voltage characteristic by combining the aforesaid two types or these items.

In order to realize the sputtering device capable of accomplishing the aforesaid objects of the present invention, the present inventors have found as a result of study that a cause of producing poor electrical insulation at the gate oxidation film consists in the fact that some charged particles near the target reach the surface of wafer, pass through a polycrystalline-silicon film of the gate electrode and a gate oxidation film and enter the silicon substrate. That is, the present inventors have estimated that a cause in which deterioration of insulating withstand voltage at the gate oxidation film occurs consists in the fact that some charged particles fly from the region of high charged particle density present near the plasma (wafer side) and a probability of particles striking against the wafer is increased.

As apparent from the measurement of erosion of the target, the region having a high plasma density is concentrated more at a peripheral part than the central part in reference to a direction of diameter of the target. Then, although the region having a high plasma density is present just near the target as viewed from a direction facing from the target to the wafer, it can be considered that the region having a high density of charged particles is rather present at the wafer side of the high plasma density region.

In view of the foregoing, in order to prevent the charged particles from flying onto the wafer and striking against it, the present inventors have completed the present invention in reference to an idea in which the collimator plate is arranged at a position near the target and further a position slightly spaced apart from the high plasma density region to the wafer side and then charged particles are caught by the collimator plate and further the present inventors have studied the positional relation between the target and the collimator plate.

In order to accomplish the aforesaid further objects of the present invention, the sputtering device of the present invention is comprised of a target held at a target holder and a wafer holder for holding a wafer having target metal accumulated thereon while being oppositely faced against the target so as to perform a sputtering of the target metal on the wafer characterized in that the collimator plate made of electrical conductor having many through-pass holes passed from the target to the wafer is present between the target holder and the wafer holder while it is being connected to the earth terminal.

In addition, as apparent from the results of the examples 1 and 2 of an experiment to be described later, the effect of presence of the collimator plate is substantially different in response to a position of the collimator plate with respect to the target and the position of the collimator plate in respect to the target has a critical meaning in regard to a prevention of deterioration of insulating withstand voltage at the gate oxidation film.

In view of the foregoing, in the preferred embodiment of the present invention, the collimator plate is arranged with respect to the target holder in an interval ranging from less than a first clearance $D_1$ to more than a second clearance $D_2$ and more preferably the sputtering device is provided with a position adjustment means for position setting the collimator plate within the clearance of aforesaid range and holding it. Although each of the first clearance $D_1$ and the second clearance $D_2$ is different from each other in view of the structure of the sputtering apparatus and the sputtering condition, and more practically, the first clearance $D_1$ is 50 mm and the second clearance $D_2$ is 24 mm due to the reasons to be described later.

In addition, it is preferable that a rate of total sum of opening area of the through-pass holes with respect to the surface area of the collimator plate, i.e. an opening rate is high and although no restriction is applied to the shape and size of the through-pass holes in the collimator plate, the collimator plate is preferably a net-like plate with an aspect ratio of the through-pass holes being 0.7 or more and 1.3 or less.

As long as the present invention relates to a sputtering device for performing a sputtering action with a glow discharging, no restriction is applied to the kind and the type of the sputtering apparatus, and the present invention can be applied to a DC sputtering apparatus, a high frequency (RF) sputtering device and a magnetron sputtering device, for example.

In the case that the collimator plate is present between the target and the wafer, a degree of deterioration of the initial withstand voltage of the gate insulating film is assumed to be dependent on a distance between the collimator plate and the target holder, an aspect ratio of the collimator plate and a sputtering rate.

In the case that the collimator plate is not present, a probability in which some charged particles flying from the region of high charged particles directly strike against the wafer becomes higher as they approach the peripheral part of the wafer, so that a degree of deterioration of initial withstand voltage of the gate insulating film around the wafer is quite remarkable as compared with that of the central part of the wafer.

For example, in the case of magnetron sputtering apparatus, a shape and a size of the cathode magnet are made different for every magnetron sputtering apparatus, resulting in that a distribution of plasma density in a direction of diameter in the target and subsequently a distribution of charged particles is made different and so although the deterioration pattern (map) becomes a specific one for each of the apparatus, a severe deterioration may occur at the peripheral part of the wafer as a usual tendency.

In addition, in the case that the collimator plate is not present, an increased value of leakage current between the gate source and the gate drain is measured as compared with that of operation performed through the presence of the collimator plate even at the central part of the wafer and it is apparent that a certain damage is applied to the gate oxidation film.

A distance between the collimator plate and the target holder (a distance between T/C) is a factor which should be decided in such a way that a probability of catching some charged particles flying directly from the region of high charged particle density may be set high and as described above, an effect of presence of the collimator plate is substantially different in response to a position of the collimator plate with respect to the target and a position of the collimator plate in respect to the target has a critical meaning. For example, if the distance between T/C is more than 50 mm, the effect of presence of the collimator plate is substantially decreased.

If the distance between T/C is made short and an incident angle of the charged particles in respect to the collimator plate is set to be large, it is possible to increase a catching probability of the charged particles at the collimator plate, so that it is possible to prevent effectively a deterioration in insulating withstand voltage at the gate oxidation film caused by flying and striking of the charged particles. However, in turn, if the distance between T/C is too short, the collimator plate is contacted with the region where the high density plasma is present, resulting in that there is a possibility that the collimator plate is processed with sputtering and cut and this is quite dangerous and the distance between T/C is set to be an allowable shortest distance (for example, 24 mm) in view of the above point of view.

Additionally, increasing of an aspect ratio of the collimator plate causes a probability of catching some charged particles from the aforesaid region of high charged particles to be increased, so that this is effective for preventing deterioration of initial insulating withstand voltage of the gate oxidation film. However, too much high aspect ratio causes some sputtering metals to be caught, resulting in that a sputtering rate is decreased.

BRIEF DESCRIPTION OF THE DRAWINGS

FIGS. 1A to 1D are sectional views for showing elements at each of the stages in a first preferred embodiment of the present invention.

FIGS. 6A and 6B are views of a configuration of the sputtering apparatus of a first preferred embodiment of the present invention.

FIGS. 7A and 7C are views of a configuration of the sputtering apparatus of each of the examples in the prior art sputtering apparatus; and FIGS. 7B, 7D and 7E are views of configurations of sputtering apparatuses in a second preferred embodiment of the present invention.

DESCRIPTION OF THE PREFERRED EMBODIMENTS

Figure 2A:
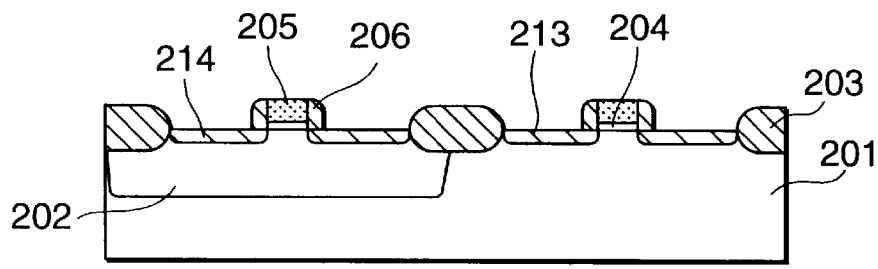
FIGS. 2A to 2D are sectional views for showing elements at each of the stages in a second preferred embodiment of the present invention.
Figure 2B:
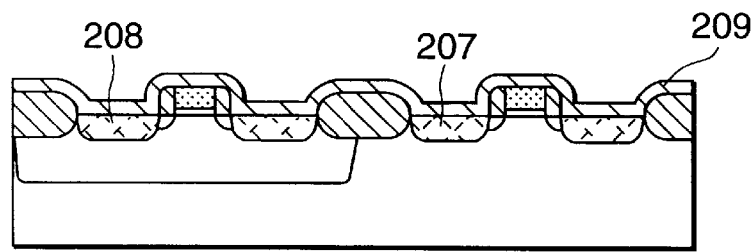

Referring now to the drawings, each of the preferred embodiments of the present invention will be described as follows.

First Preferred Embodiment of Method for Manufacturing Semiconductor Device of the Present Invention FIGS. 1A to 1D are sectional view for showing elements in each of stages of a first preferred embodiment of the method for manufacturing the semiconductor device of the present invention. At first, as shown in FIG. 1A, an N-type well 102 is formed at a P-type silicon substrate 101 by a well-known method. Then, a field oxidation film 103 acting as a field insulating film is formed on the surface of the P-type silicon substrate 101 by a selective oxidation process. A gate insulating film 104 such as a silicon oxidation film or the like and a poly-crystalline silicon are grown at an active region enclosed by the field oxidation film 103, phosphorus is doped in the poly-crystalline silicon by a well-known method to reduce an electrical resistance of the poly-crystalline silicon.

Then, the poly-crystalline silicon is processed with patterning by a photo-lithographic processing and a dry etching processing which are usual well-known methods to form the gate electrode 105 as shown in FIG. 1A. Then, both an N-type impurities dispersion layer 113 of low concentration and a P-type impurities dispersion layer 114 of low concentration are formed by a photo-lithographic processing and an ion inplanting method. Then, a spacer 106 constituted by a silicon oxide film or a silicon nitride film is formed at the side surface of the gate electrode 105 under application the well-known CVD technology and the etching technology.

Then, as shown in FIG. 1B, both a source/drain region 107 of an N-type impurities dispersion layer and a source/drain region 108 of a P-type impurities dispersion layer are formed by the photo-lithography and the ion inplanting process. In this way, as an LDD structure, both the N-type source/drain region 107 and the P-type source/drain region 108 are formed.

Then, the surface of the poly-crystalline silicon acting as the gate electrode 105 and the natural oxidation film at the surface of the semiconductor substrate are removed, a magnetron sputtering apparatus having a condition with an amount of electrical load Q reaching the gate electrode 105, for example, may become 5 C/cm$^2$ or less is applied and titanium of metal with high melting point is accumulated in sputtering to form a titanium film 109. In this case, a net-like electrical conductor, for example, a collimator plate is inserted between the wafer and the target at the magnetron sputtering device and then the sputtering is carried out.

FIGS. 6A and 6B are view of configuration of one example of the magnetron sputtering device used in the first preferred embodiment of the present invention. The magnetron sputtering device shown in FIG. 6A is constructed such that a wafer 63 is mounted on a wafer holder 62 within a chamber 61, and a cathode magnet 64 and a target 65 are arranged at positions spaced apart and oppositely faced against the wafer and then a collimator plate 66 is arranged in a spatial position between the wafer 63 and the target 65.

The collimator plate normally used is used for improving an isotropy characteristic of sputtering particles and although an aspect ratio of the net is about 1, the collimator plate 66 used in this sputtering apparatus is constituted by the net-like electrical conductor as shown in the top plan view of FIG. 6B. In this case, it is satisfactory that the collimator plate 66 is made such that the electrical conductive plate is merely inserted between the wafer and the target, an aspect ratio, size and shape of the collimator plate may be option, an entire surface of the wafer 63 is not necessarily covered and only the region where a high distribution of plasma intensity is found or an electrical charging may easily be produced is covered.

Further, as to the shape of the collimator plate 66, its size and shape may sufficiently be adjusted by the sputtering device. Although the net-like electrical conductor of the collimator plate 66 may be applied as a ground potential, its effect may be increased more by applying an electrical potential in correspondence with a plasma state. In addition, although the first preferred embodiment shows as its one example the titanium film 109 which is accumulated, it is of course apparent that a similar effect may be attained if other metals with high melting point such as cobalt, nickel or the like are accumulated.

Then, as shown in FIG. 1C, a fast heat treatment (RTA) at 700° C. or less is carried out under the nitrogen atmosphere to form a titanium silicide layer 110 of C49 type structure only at an interface between the surface of the gate electrode 105 of the poly-crystalline silicon and the titanium film 109 contacted with the source/drain regions 107 and 108. In addition, in this case, the field oxidation film 103, a titanium film 109 contacted with the spacer 106 and a part of the titanium film 109 on the semiconductor substrate are nitrided to form a titanium nitride film 111.

Then, as shown in FIG. 1D, the substrate is selectively etched in wetted state by mixture solution of ammonia solution and hydrogen peroxide solution or the like and then only non-reacted titanium and the titanium nitride film 111 are removed. Then, RTA at higher temperature (800° C. or more) than that of the aforesaid RTA is carried out to form the titanium silicide 112 of C54 type structure having a lower electrical resistivity than that of the titanium silicide layer 110 of the aforesaid C49 type structure.

In the MOS field effect transistor manufactured in this way, no deterioration of gate withstand voltage occurs due to the sputtering action and then a superior gate withstand voltage can be attained. Due to the fact that the collimator plate 66 is inserted between the wafer 63 and the target 65, an electrical load which must be reached to the wafer 63 flows to the collimator plate 66 and the charging-up at the gate electrode 105 is restricted.

In this way, in the case that metal with high melting point is accumulated in sputtering on the floating gate electrode having the silicide structure, a method for controlling an amount of electrical load reaching to the wafer enables a characteristic of gate withstand voltage to be improved by prohibiting the generated electrical load from being reached to the wafer.

Second Preferred Embodiment of Method for Manufacturing Semiconductor Device of the Present Invention As shown in FIG. 2A, an N-type well 202 is formed at a P-type silicon substrate 201 by a well-known method. Then, a field oxidation film 203 acting as a field insulating film is formed on the surface of the P-type silicon substrate 201 by a selective oxidation process. A gate insulating film 204 such as a silicon oxidation film or the like and a poly-crystalline silicon are grown at an active region enclosed by the field oxidation film 203, phosphorus is doped in the poly-crystalline silicon by a well-known method to reduce an electrical resistance of the poly-crystalline silicon. Then, the poly-crystalline silicon is processed with patterning by a photo-lithographic processing and a dry etching processing which are usual well-known methods to form the gate electrode 205 as shown in FIG. 2A.

Then, both an N-type impurities dispersion layer 213 of low concentration and a P-type impurities dispersion layer 214 of low concentration are formed by a photo-lithographic processing and an ion implanting method. Then, a spacer 206 constituted by a silicon oxide film or a silicon nitride film is formed at the side surface of the gate electrode 205 under application the well-known CVD technology and the etching technology.

Then, as shown in FIG. 2A, both a source/drain region 207 of an N-type impurities dispersion layer and a source/drain region 208 of a P-type impurities dispersion layer are formed by the photo-lithography and the ion inplanting process. Then, the surface of the poly-crystalline silicon acting as the gate electrode 205 and the native oxidation film at the surface of the semiconductor substrate are removed, a magnetron sputtering apparatus having a condition with an amount of electrical load Q reaching the gate electrode 105, for example, may become 5 $C/cm^2$ or less is applied and titanium of metal with high melting point is accumulated in sputtering to form a titanium film 209.

In FIGS. 7B, 7D or 7E is shown a configuration of the magnetron sputtering apparatus used in this case. As shown in FIG. 7A, although as a sputtering apparatus shown in the prior art, it is known to provide a sputtering device having no magnet holder therein in which a wafer 73 is mounted on a wafer holder 72 within a chamber 71, and a target 74 is arranged at a position spaced apart and oppositely faced against the wafer 73, a detailed result of experiment performed by the present inventors showed that the region having the maximum-plasma-density 75 indicated the maximum deterioration in gate initial withstand voltage.

To the contrary, the magnetron sputtering apparatus shown in FIG. 7B is a magnetron sputtering device having a structure not provided with any holder magnet, wherein there is provided a target 76 of which size is set to cause the region having the maximum-plasma-density 77 to be placed outside the substrate (wafer) and in the case that the aforesaid titanium film 209 is accumulated in sputtering process, the electrical load generated from the plasma 77 can not be reached to the wafer 73, resulting in that a superior electrical characteristic can be attained.

In addition, although the magnetron sputtering apparatus shown in FIGS. 7A and 7B has a structure in which the plasmas 75, 77 are directly contacted with the wafer 73, as the prior art magnetron sputtering device, it is also known in the art to provide a magnetron sputtering device having such a structure as one in which the holder magnet 79 is installed while the plasma 80 is not contacted with the wafer 73 as shown in FIG. 7C. That is, in the prior art magnetron sputtering apparatus, the wafer 73 is mounted on the wafer holder 72 within the chamber 71 through the holder magnet 79 and the plasma 80 produced from the target 74 is not contacted with the wafer 73.

However, also in this prior art magnetron sputtering apparatus, the electrical load generated from the plasma ($Ar^+$ or electrons) reaches the wafer 73, thereby a poor gate initial withstand voltage is similarly produced. A detailed result of experiments performed by the present inventors also showed a deterioration point of the gate initial withstand voltage around the wafer 73.

In view of the foregoing, as the magnetron sputtering apparatus having a structure with this holder magnet therein, the preferred embodiment of the present invention performs the sputtering accumulation of the titanium film 209 under application of the magnetron sputtering apparatus having the structure shown in FIG. 7D or FIG. 7E under a condition in which the electrical charge Q reaching the gate electrode may become 5 $C/cm^2$ or less. The magnetron sputtering apparatus shown in FIG. 7D has a feature in that the holder magnet 81 fixed to make a stable state of plasma is formed to cover the bottom surface of the wafer 73, thereby the electrical load generated from the plasma 82 is trapped by a magnetic field of the holder magnet 81 and then a poor gate initial withstand voltage can be restricted.

In addition, the magnetron sputtering apparatus shown in FIG. 7E has a feature that an intensity of magnetic field of the holder magnet 83 fixed to stabilize plasma is set to such a location as one in which maximum-plasma-density region plasma 84 is higher than the wafer 73, thereby an electrical load generated from the plasma 84 is trapped by the magnetic field of the holder magnet 83 and then a poor gate initial withstand voltage can be restricted.

In the case of the magnetron sputtering apparatus having the structure shown in FIG. 7D or FIG. 7E, the electrical load is trapped by the magnetic fields generated from the holder magnets 81, 83, thereby no deteriorated point is found around the peripheral part and a superior electrical characteristic can be attained. Actually, since the degree of deterioration of the gate initial withstand voltage is varied in response to the structure of the magnetron sputtering apparatus, it may be considered to have the most suitable state under a combination of a method for changing the aforesaid maximum-plasma-density region and another method for trapping with the magnetic field generated by the holder magnet at the wafer side.

Although the example in which titanium is accumulated is shown in the second preferred embodiment, it is of course apparent that a similar effect can be attained also by accumulating another metal with high melting point such as cobalt, nickel or the like.

Figure 2C:
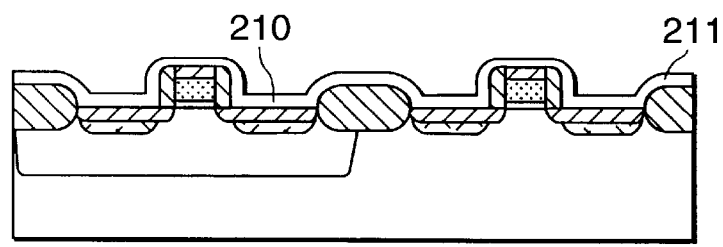

Referring again to FIGS. 2A to 2D, a fast heat treatment (RTA) with 700° C. or less is carried out under nitrogen atmosphere as shown in FIG. 2C, a titanium silicide 210 having C49 type structure is formed only at an interface between the surface of the gate electrode 205 of the poly-crystalline silicon and the titanium film 109 contacted with the source/drain regions 107 and 108. In this case, as shown in FIG. 2C, the field oxidation film 203, a titanium film 209 contacted with the spacer 206 and a part of the titanium film 209 on the semiconductor substrate are nitrided to form a titanium nitride film 211.

Figure 2D:
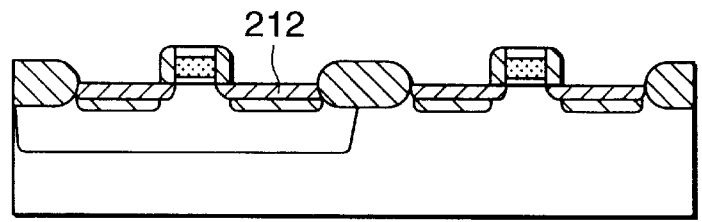
Figure 3A:
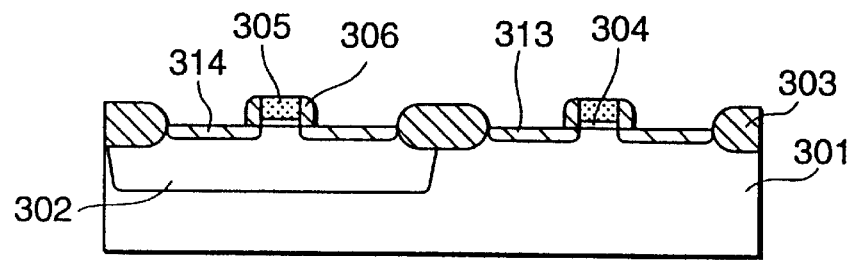
FIGS. 3A to 3D are sectional views for showing elements at each of the stages in one example of the prior art.
Figure 3B:
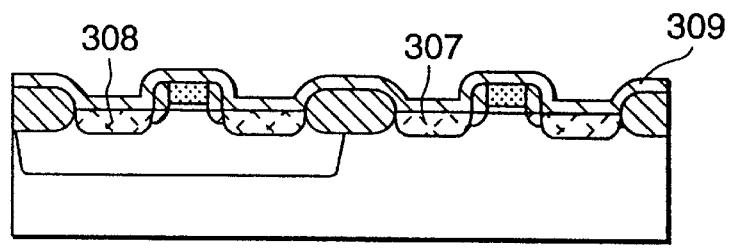
Figure 3C:
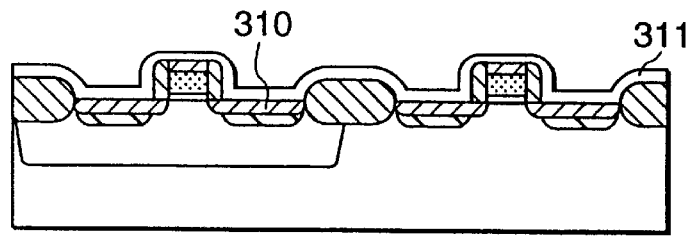
Figure 3D:
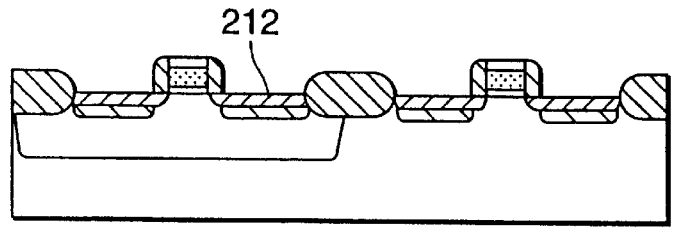
Figure 4:
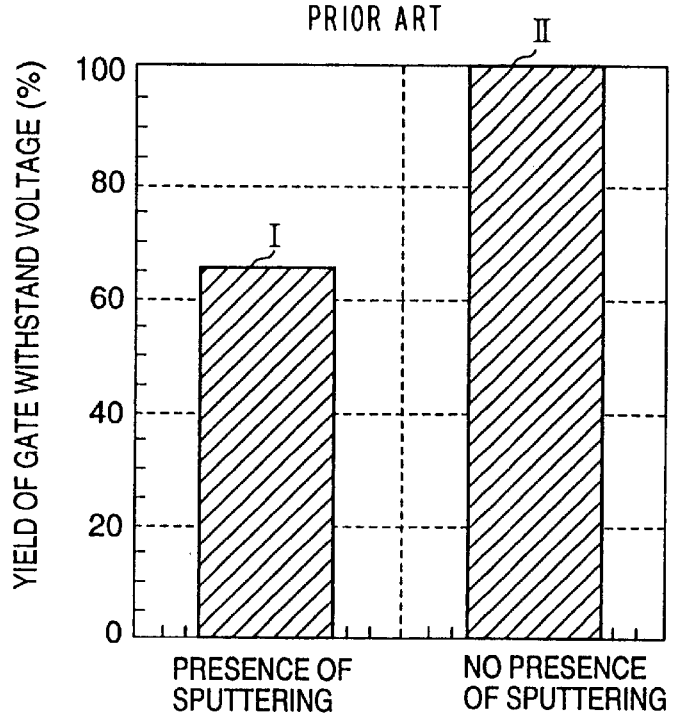
FIG. 4 is a view for showing a yield rate at a gate withstand voltage in the case that the operation is carried out under the prior art sputtering condition.
Figure 5:
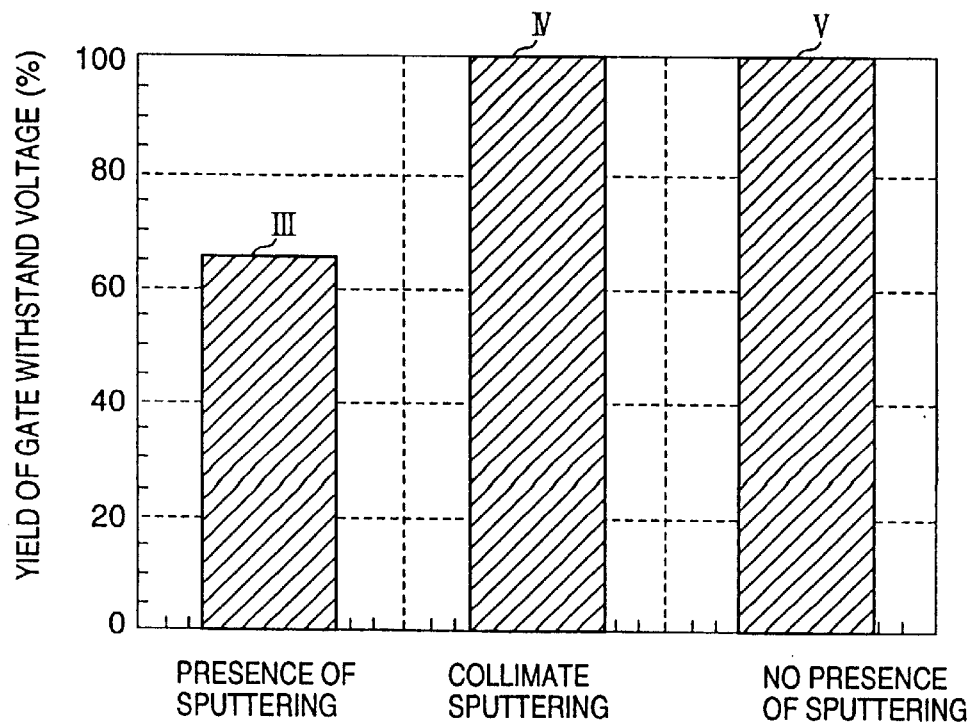
FIG. 5 is a view for showing a yield rate at a characteristic of gate withstand voltage in the case that the collimator plate is inserted.

Then, as shown in FIG. 2D, the substrate is selectively etched in wetted state by mixture solution of ammonia solution and hydrogen peroxide solution or the like and then only non-reacted titanium and the titanium nitride film 211 are removed. Then, RTA at higher temperature (800° C. or more) than that of the aforesaid RTA is carried out to form the titanium silicide 212 of C54 type structure having a lower electrical resistivity than that of the titanium silicide 210 of the aforesaid C49 type structure.

In the preferred embodiment, the constitution of the magnetron sputtering apparatus is constructed as shown in FIGS. 7B, 7D or 7E, thereby the electrical load generated from plasma does not reach the wafer and the deterioration of the gate initial withstand voltage is restricted. In addition, the magnetron sputtering device used in the first preferred embodiment has a net-like collimator plate of electrical conductor inserted therein, so that the sputtered film is accumulated on the net-like collimator plate and it is necessary to replace the collimator plate due to some problems such as reduction in sputtering rate on the wafer or particles or the like and to the contrary, the magnetron sputtering apparatus used in the second preferred embodiment does not have any net-like collimator plate of electrical conductor, resulting in that it has some advantages that it does not become necessary to replace the collimator plate and the device can be kept in a stable manner.

In addition, although the aforesaid first and second preferred embodiments have indicated the method for forming silicide on the gate and the dispersion layer in a concurrent manner, it is of course apparent that the present invention can be applied to the case in which metal with high melting point is sputtered on a floating gate of POLICIDE gate (WSix/Poly-Si), poly-crystalline-metal gate (W/WNx/Poly-Si) or metal gate (W/SiO$_2$) structure to form silicide on the dispersion layer.

Preferred Embodiment of the Sputtering Apparatus of the Present Invention

Figure 8:
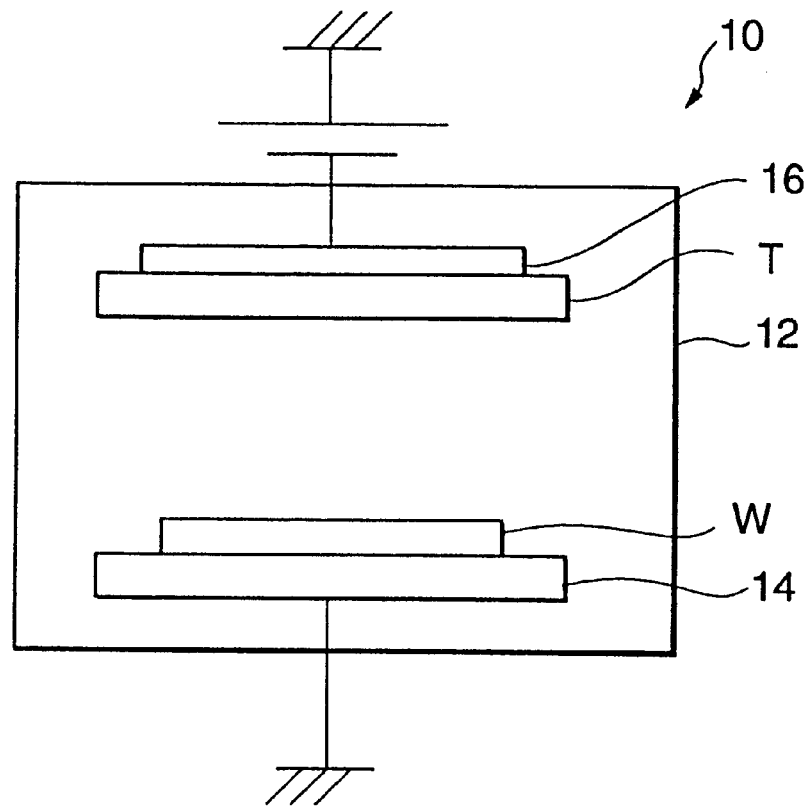
FIG. 8 is a schematic view for showing a configuration of the conventional sputtering apparatus.
Figure 10A:
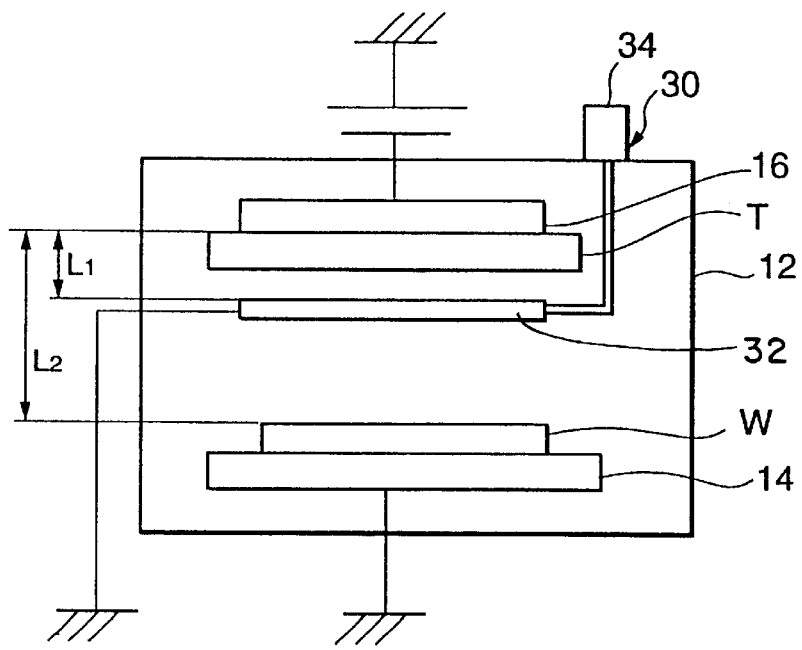
FIG. 10A is a schematic view for showing a configuration of the sputtering device of the preferred embodiment.
Figure 10B:
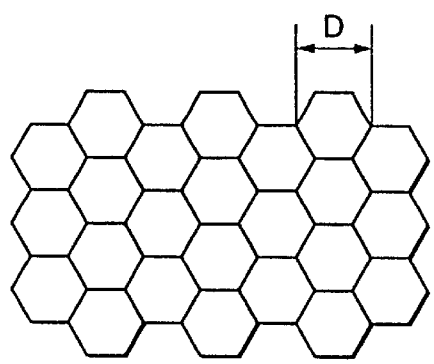
FIG. 10B is a top plan view for showing the collimator plate.
Figure 10C:
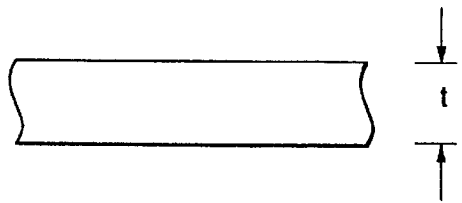
FIG. 10C is a side elevational view for showing the collimator plate.
Figure 11:
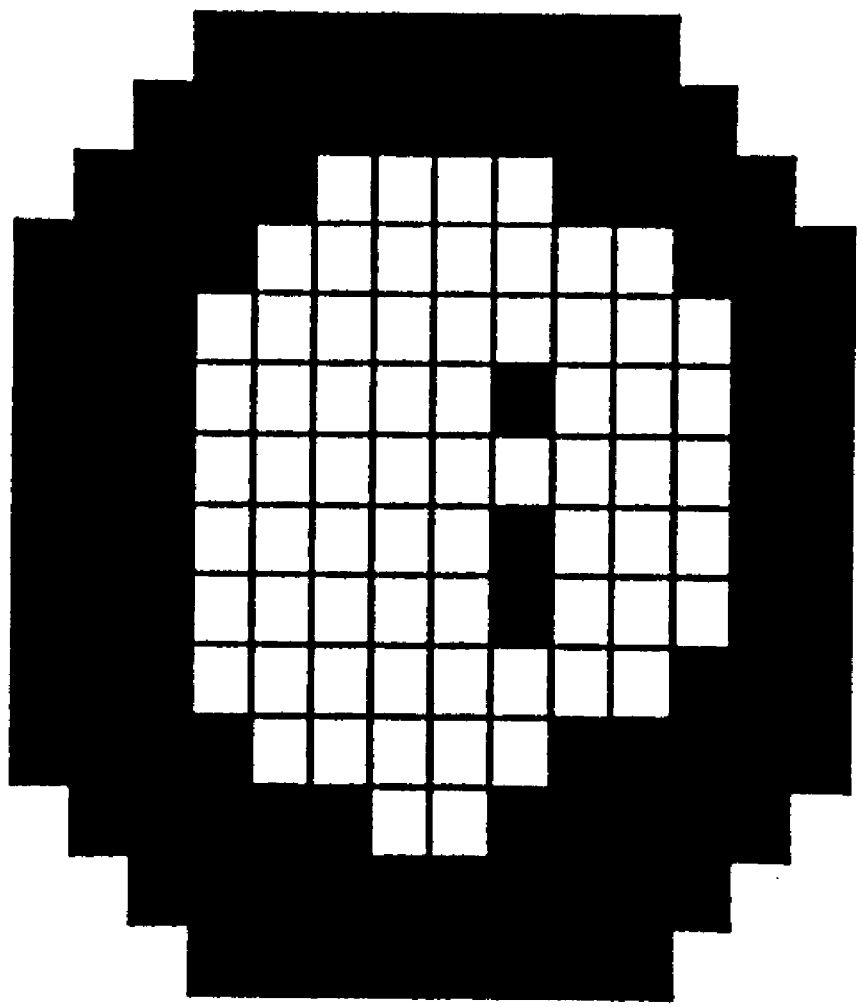
FIG. 11 is a wafer map for showing a deterioration of a gate oxidation film when the sputtering is carried out under an application of the prior art sputtering apparauts.
Figure 12C:
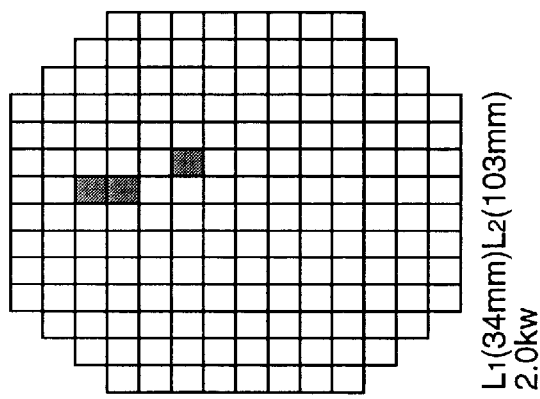
FIGS. 12A to 12C are wafer maps for showing a deterioration of a gate oxidation film when the sputtering is carried out under a relative different condition by applying the sputtering device of the preferred embodiment of the present invention, respectively.
Figure 12B:
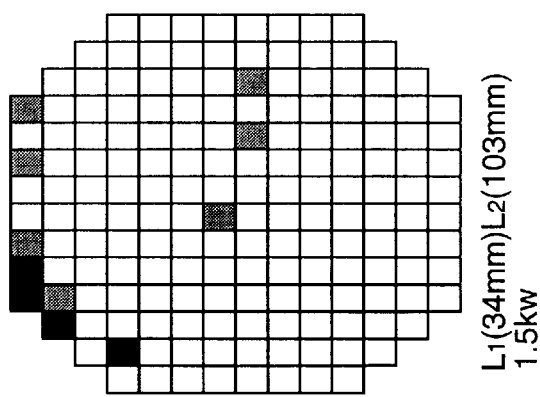
Figure 12A:
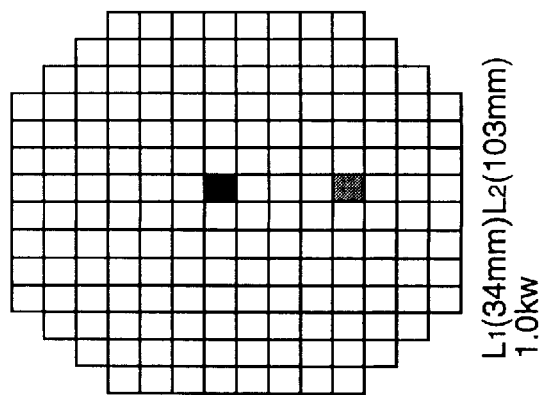
Figure 13C:
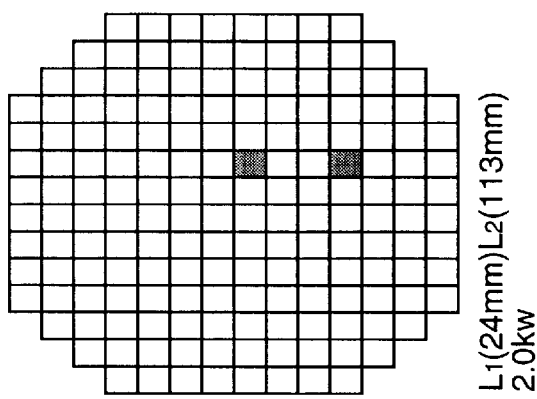
FIGS. 13A to 13C are wafer maps for showing a deterioration of a gate oxidation film when the sputtering is carried out under a relative different condition by applying the sputtering apparatus of the preferred embodiment of the present invention, respectively.
Figure 13B:
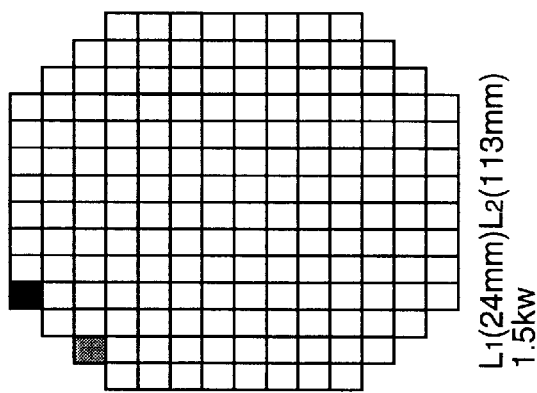
Figure 13A:
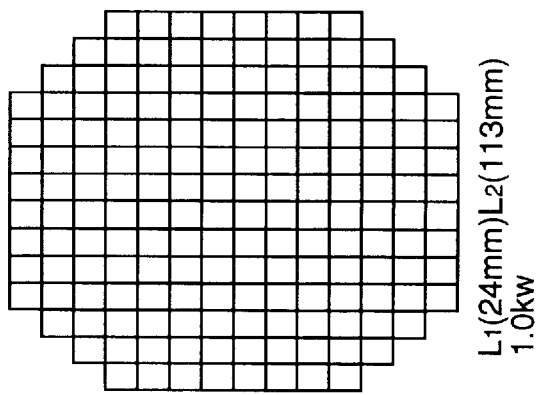
Figure 14C:
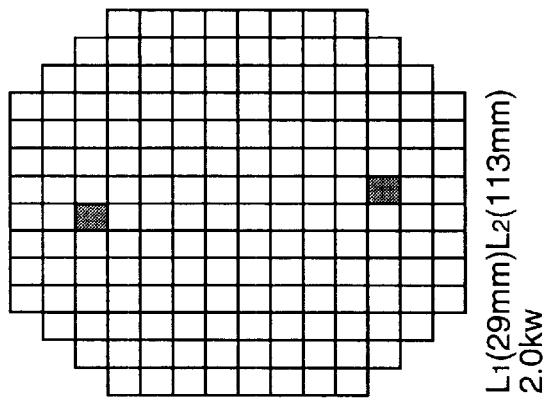
FIGS. 14A to 14C are wafer maps for showing a deterioration of a gate oxidation film when the sputtering is carried out under a relative different condition by applying the sputtering apparatus of the preferred embodiment of the present invention, respectively.
Figure 14B:
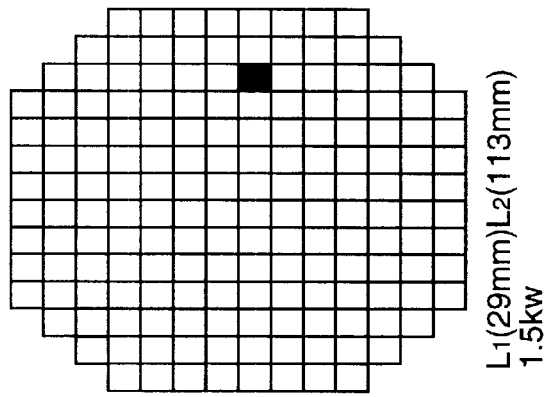
Figure 14A:
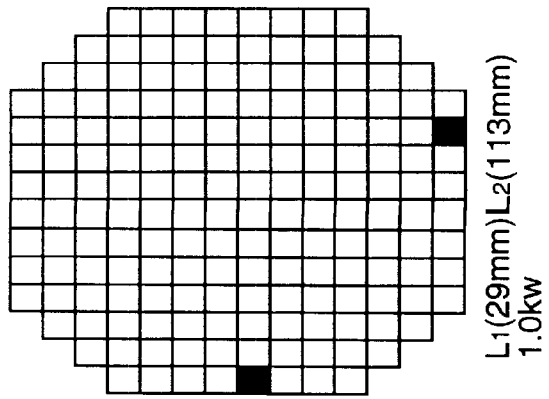
Figure 15C:
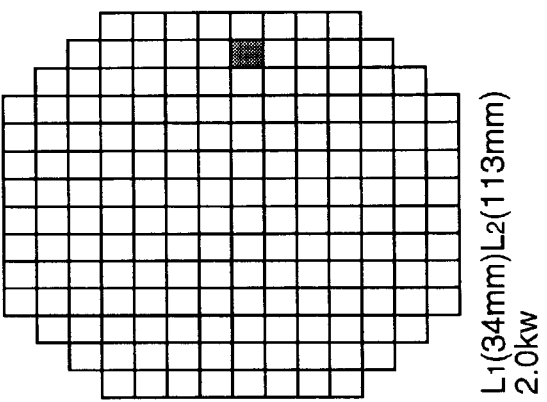
FIGS. 15A to 15C are wafer maps for showing a deterioration of a gate oxidation film when the sputtering is carried out under a relative different condition by applying the sputtering apparatus of the preferred embodiment of the present invention, respectively.
Figure 15B:
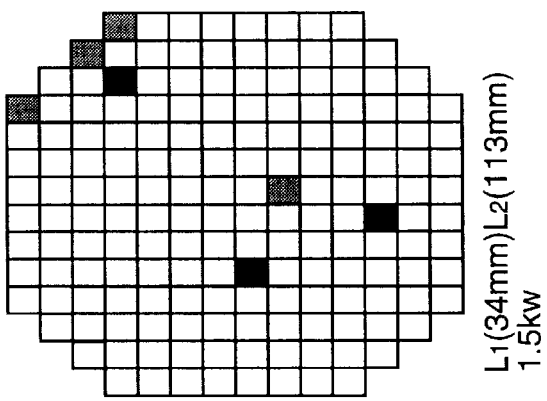
Figure 15A:
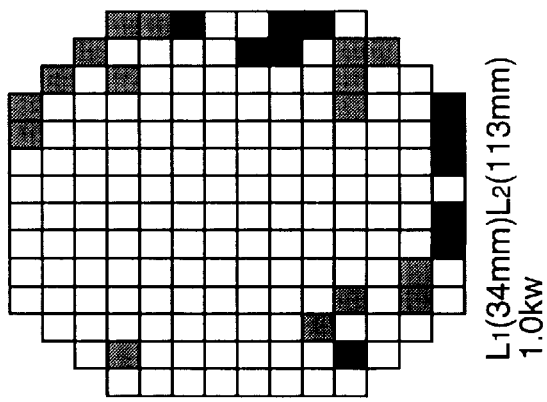
Figure 16C:
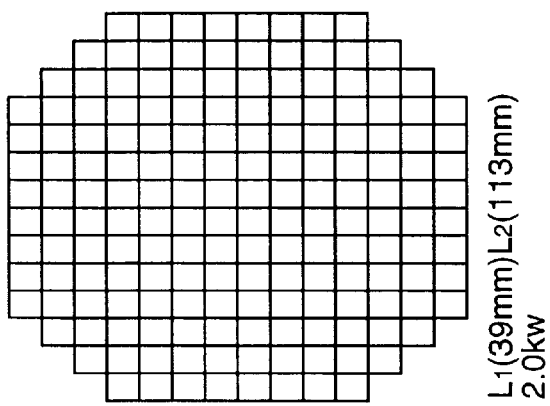
FIGS. 16A to 16C are wafer maps for showing a deterioration of a gate oxidation film when the sputtering is carried out under a relative different condition by applying the sputtering device of the preferred embodiment of the present invention, respectively.
Figure 16B:
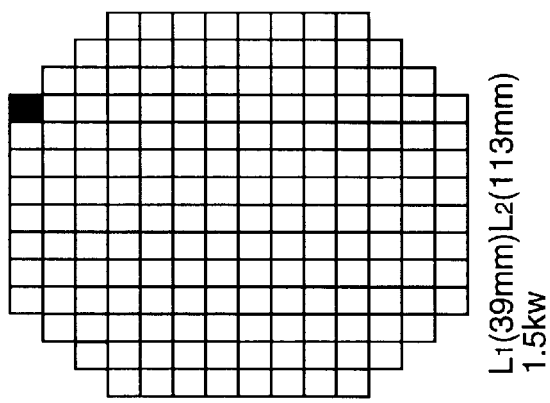
Figure 16A:
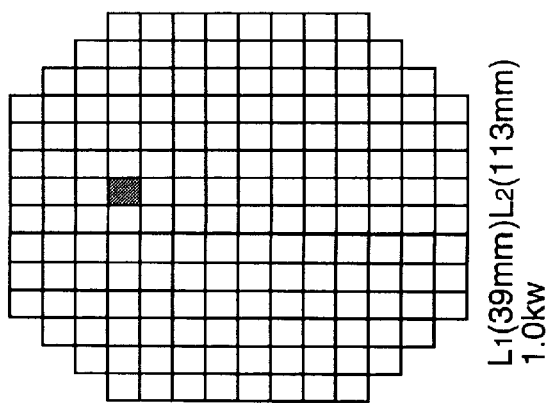
Figure 17C:
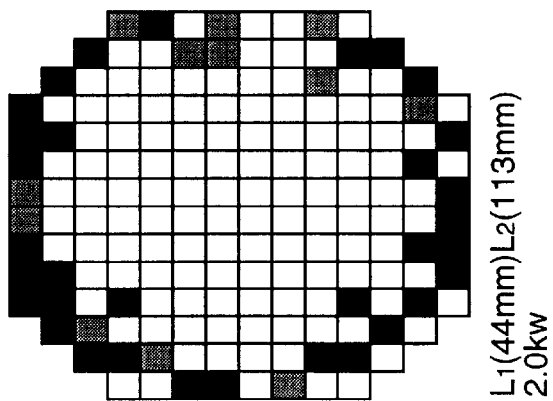
FIGS. 17A to 17C are wafer maps for showing a deterioration of a gate oxidation film when the sputtering is carried out under a relative different condition by applying the sputtering apparatus of the preferred embodiment of the present invention, respectively.
Figure 17B:
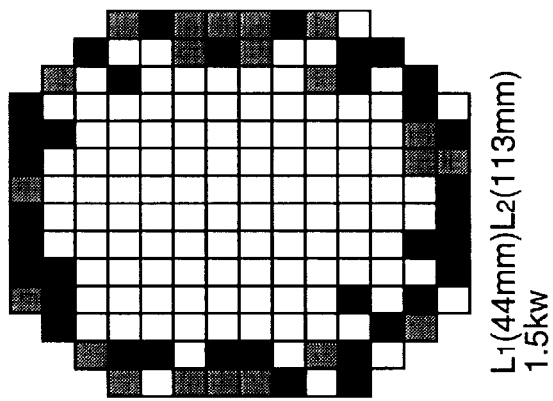
Figure 17A:
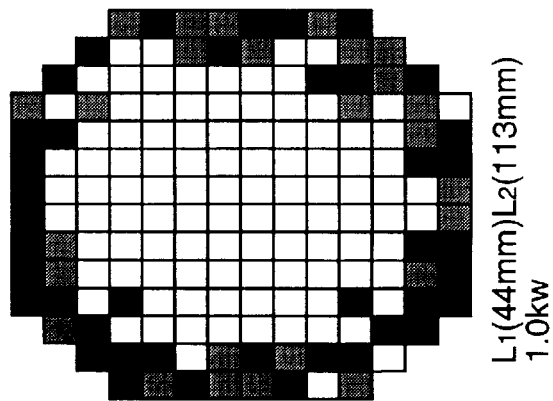
Figure 18C:
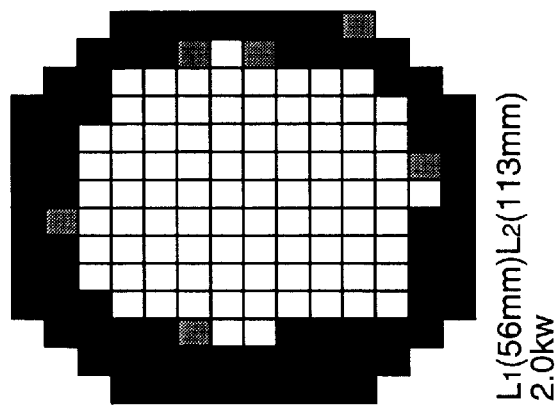
FIGS. 18A to 18C are wafer maps for showing a deterioration of a gate oxidation film when the sputtering is carried out under a relative different condition by applying the sputtering apparatus of the preferred embodiment of the present invention, respectively.
Figure 18B:
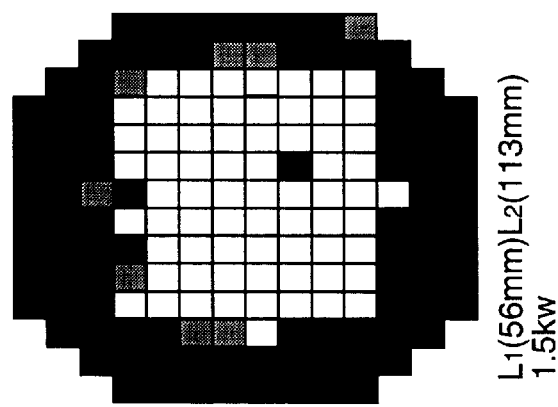
Figure 18A:
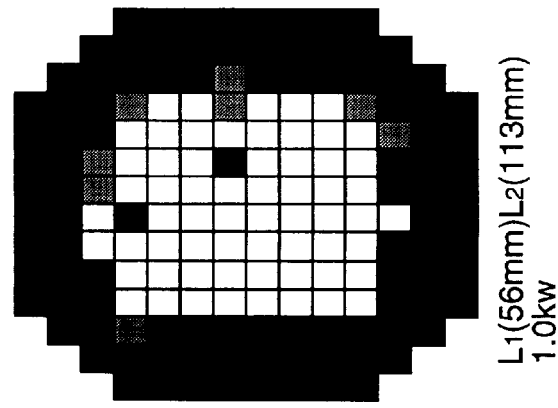

The preferred embodiment of the present invention is one example of the preferred embodiments in which the sputtering apparatus of the present invention is applied to the magnetron sputtering apparatus, wherein FIG. 10A is a schematic sectional view for showing a configuration of the magnetron sputtering apparatus of the preferred embodiment, FIG. 10B is a top plan view for showing a collimator plate and FIG. 10C is a side elevational view for showing the collimator plate. In FIGS. 10A to 10C, the same component and locations as those shown in FIG. 8 have the same symbols.

As shown in FIGS. 10A to 10C, the magnetron sputtering apparatus 30 of the preferred embodiment is basically comprised of the same configuration as the aforesaid magnetron sputtering apparatus shown in FIGS. 6A and 6B, wherein within the sputtering chamber 12 are installed a wafer holder 14 on which a wafer W is mounted, a cathode magnet 16 for holding a target T at a position spaced apart and oppositely faced against the wafer W, and a net-like collimator plate 32 arranged between the wafer holder 14 and the cathode magnet 16.

The collimator plate 32 is provided to improve an isotropic characteristic of the sputtering particles and to catch the charged particles and as shown in FIG. 10B, this is constituted as a net-like plate of electrical conductor having some continuous hexagonal shapes and connected to a ground terminal. The nets or holes of hexagonal shapes of the collimator plate 32 pass from the target T toward the wafer W and an aspect ratio of the nets or holes is 1. That is, a thickness (t) of the collimator plate (refer to FIG. 10C) and a diameter D of the net or hole (a maximum diameter of the net or the hole, refer to FIG. 10B) have the same size.

In addition, the collimator plate 32 is made such that a distance ranging from the surface of the collimator plate 32 to the target holding surface of the cathode magnet 16 (a distance between T/C, it is designated by $L_1$ in FIG. 10A) is changed by the position adjustment mechanism 34 and it is held at that position. The position adjustment mechanism 34 is a well-known existing mechanism operated to freely ascend or descend the collimator plate 32 by a driving device such as a hydraulic cylinder and an air cylinder or the like.

Further, it is not necessary that an area of the collimator plate 32 covers an entire surface of the wafer W and this covers only the region where a distribution of intensity of plasma is high or some charged particles may easily be produced.

EXAMPLE OF EXPERIMENT 1

The present inventors performed a sputtering experiment with an experiment device having the same configuration as that of the magnetron sputtering device 30 of the preferred embodiment in which the collimator plate is installed at a device having a model No. I-1060 manufactured by Anelva Co., Ltd. Specification of the experimental device will be briefly indicated.

| Target: | |
|---|---|
| Thickness | 3 mm |
| Diameter | 12 inch |
| Wafer Holder: | |
| Wafer size | 6-inch diameter or 8-inch diameter |
| Chuck system | Clamp chuck |
| Collimator Plate: | |
| Hole diameter D | 23 mm |
| Thickness t | 23 min |
| Hole shape | Continuous shape of regular hexagon |
| Aspect ratio | 1 |
| Material quality | Stainless steel |

Figure 9:
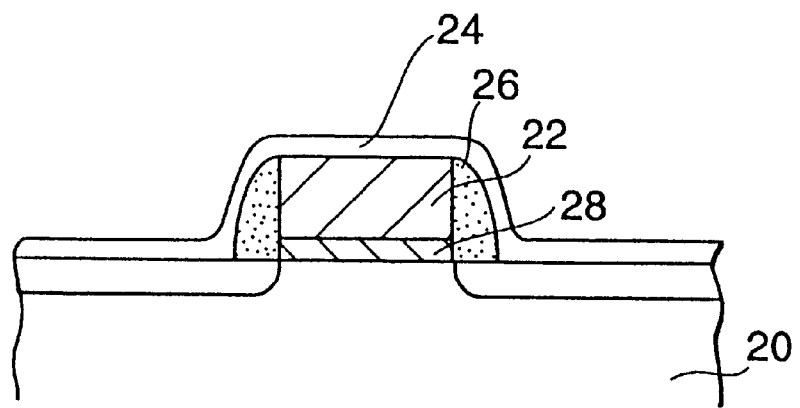
FIG. 9 is an illustrative view for showing a silicide formation after cobalt sputtering operation.

In the aforesaid experiment apparatus, a distance between the target holding surface of the cathode magnet 16 and the surface of the wafer W (a distance between W/S, it is designated by $L_2$ in FIG. 10A) was adjusted to 103 mm, a distance $L_1$ between the target holding surface of the cathode magnet 16 and the opposing surface of the collimator plate 32 was adjusted to 34 mm, a sputtering electrical power applied between the wafer holder 14 and the cathode magnet 16 was changed to 1.0 kW, 1.5 kW and 2.0 kW, Co was sputtered under the following sputtering condition and then a Co film having a film thickness of 100 Å was formed on the polycrystalline-silicon film shown in FIG. 9.

Sputtering Condition

Holder temperature: Room temperature

Chamber pressure: 3 to 8 mTorr

Then, the present inventors checked a condition of the insulating withstand voltage of the gate oxidation film for every chip and colored a chip having a quite high degree of poor insulating state of the gate oxidation film in black and another chip having a light degree of poor insulating state in gray.

EXAMPLE OF EXPERIMENT 2

The present inventors used the same experiment apparatus as that of the example of experiment 1, adjusted a distance $L_2$ between the target holding surface of the cathode magnet 16 and the surface of the wafer W to 113 mm, changed a distance $L_1$ between the target holding surface of the cathode magnet 16 and an opposing surface of the collimator plate 32 to 24 mm, 29 mm, 34 mm, 39 mm, 44 mm and 56 mm, respectively, changed a sputtering electrical power applied between the wafer holder 14 and the cathode magnet 16 to 1.0 kW, 1.5 kW and 2.0 kW, respectively, and performed a Co sputtering under a total number of 18 different conditions. As to other conditions, they are the same sputtering condition as that of the example of experiment 1.

Then, the present inventors checked a condition of the insulating withstand voltage of the gate oxidation film for every chip and colored a chip having a quite high degree of poor insulating state of the gate oxidation film in black and another chip having a light degree of poor insulating state in gray as shown in FIGS. 13A to 13C to FIGS. 18A to 18C, respectively.

Figure 19:
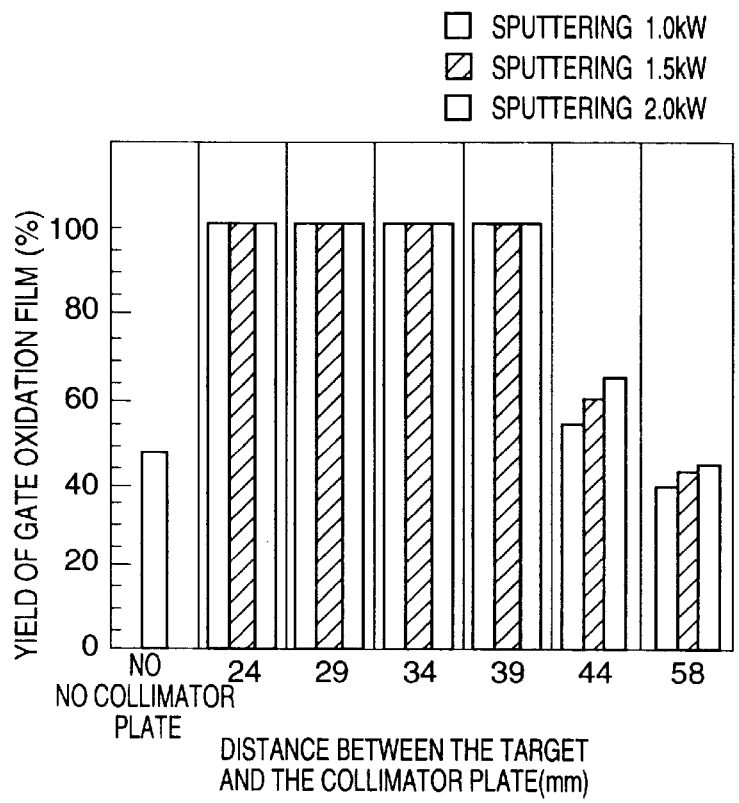
FIG. 19 is a graph in which results of experiments 1 and 2 are collected with a sputtering electrical power being applied as a parameter.

As shown in FIG. 19, the present inventors collected the results of example of experiments 1 and 2 with the sputtering electrical power being applied as a parameter. In FIG. 19, its abscissa has $L_1$ and ordinate has a yield rate (%) of the gate oxidation film.

As apparent from FIG. 19, irrespective of the value of the sputtering electrical power, a yield rate at a condition with $L_1$ being 39 mm or less reaches approximately to 100% and in turn, a yield rate is rapidly decreased to 60% or less under a condition with $L_1$ being 44 mm or more. That is, it is apparent that as to a yield rate of the gate oxidation film, i.e. an effect of presence of the collimator plate 32, an apparent critical position of the collimator plate 32 in respect to the target or the cathode magnet is present between 39 mm and 44 mm.

A bar graph at the left end in FIG. 19 shows a numerical value of the yield rate when the collimator plate is not present and this is approximately the same as that of the yield rate with $L_1$ being 56 mm.

EXAMPLE OF EXPERIMENT 3

Figure 20:
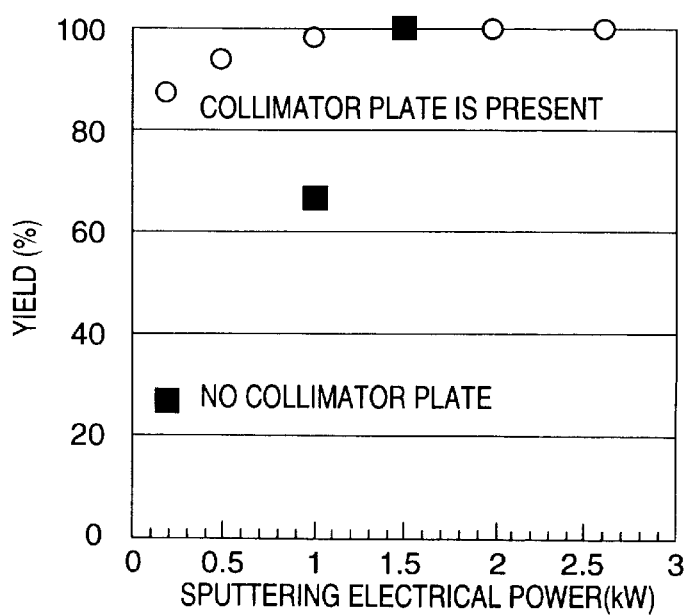
FIG. 20 is a graph for showing a dependency of yield rate on sputtering power.

The present inventors used the same experiment device as that of the example of experiment 1, set a distance $L_1$ between the cathode magnet and the collimator plate to 29 mm, a distance $L_2$ between the cathode magnet and the wafer holder to 68 mm, checked a relation between a sputtering electrical power (kW) and the yield rate of the gate oxidation film under the following sputtering condition and showed the result in FIG. 20. In addition, for a sake of comparison, the present inventors used the magnetron sputtering apparatus having the same configuration as that of the experimental apparatus except the fact that no collimator plate was provided, performed a sputtering operation and showed it in FIG. 20 together with its result.

Sputtering Condition

Chamber pressure: 8 to 10 mTorr

Gas flow rate: 80 to 100 scc/m

Sputtering power: 1.5 kW

As apparent from FIG. 20, the collimator plate is arranged in a relation of distance specified by the present invention, thereby as compared with the magnetron sputtering apparatus not provided with the collimator plate, the magnetron sputtering apparatus of the preferred embodiment has a quite low dependency of the yield rate of the gate oxidation film on the sputtering electrical power.

EXAMPLE OF EXPERIMENT 4

Figure 21:
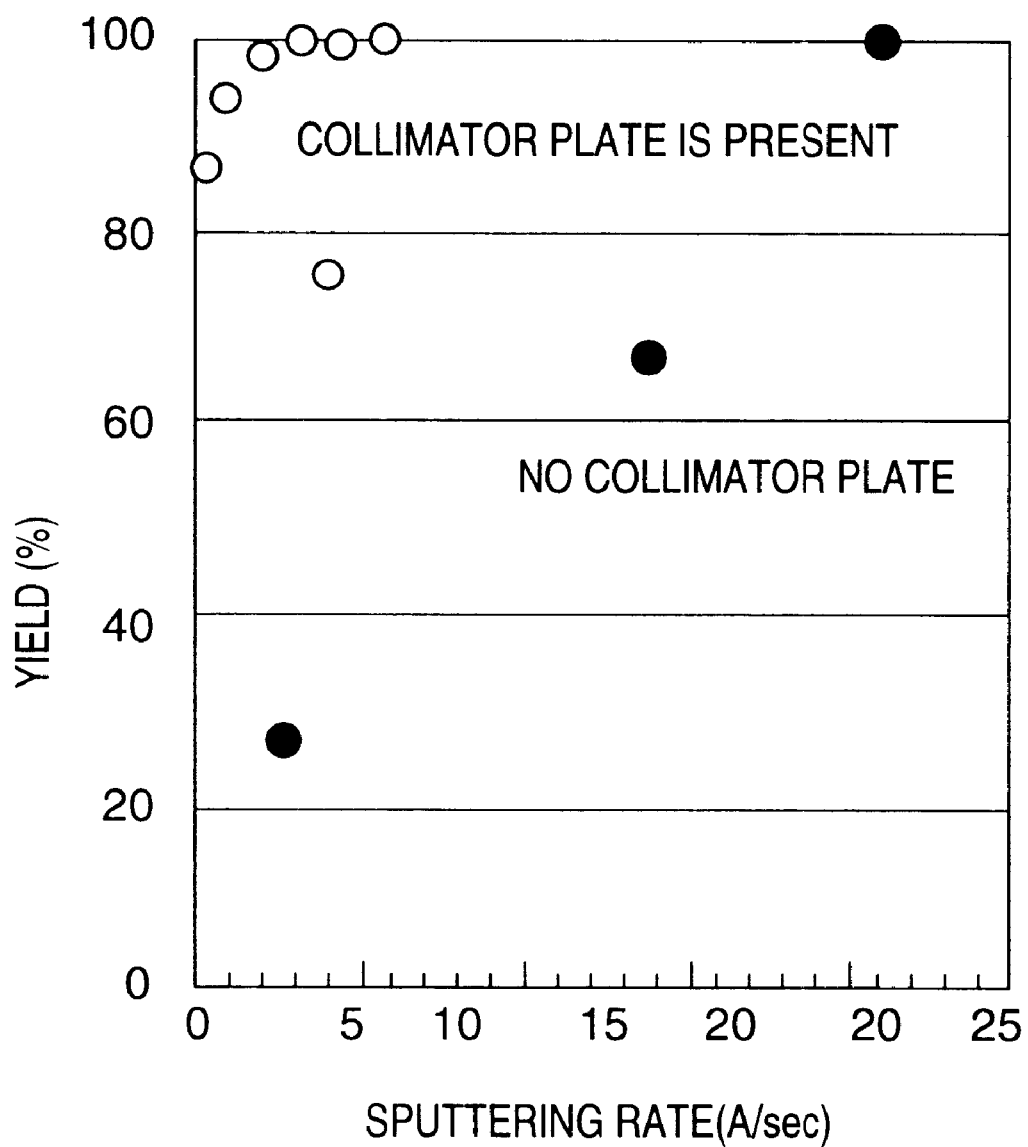
FIG. 21 is a graph for showing a dependency of yield rate on sputtering rate.

The present inventors used the same experiment apparatus as that of the example of experiment 1, set a distance $L_1$ between the cathode magnet and the collimator plate to 29 mm, a distance $L_2$ between the cathode magnet and the wafer holder to 68 mm, checked a relation between a sputtering rate (Å/sec) and the yield rate of the gate oxidation film under the following sputtering condition and showed the result in FIG. 21. In addition, for a sake of comparison, the present inventors used the magnetron sputtering apparatus having the same configuration as that of the preferred embodiment except the fact that no collimator plate was provided, performed a sputtering operation and showed it in FIG. 21 together with its result.

Sputtering Condition

Chamber pressure: 8 to 10 mTorr

Gas flow rate: 80 to 100 scc/m

Sputtering power: 1.5 kW

As apparent from FIG. 21, the collimator plate is arranged in a relation of distance specified by the present invention, thereby as compared with the magnetron sputtering apparatus not provided with the collimator plate, the magnetron sputtering apparatus of the preferred embodiment has a low dependency of the yield rate of the sputtering rate.

To the contrary, since the electrical conductive metal (or metal silicide) fastly covers the surface of the wafer by increasing the sputtering rate, the charged particles may advance in a horizontal direction of the wafer rather than a depth direction of the gate, resulting in that a probability in deterioration of initial withstand voltage of the gate oxidation film becomes low.

Accordingly, as shown in FIG. 21, it is effective to increase the sputtering rate for preventing a deterioration of initial insulating withstand voltage of the gate oxidation film. However, too fast sputtering rate causes a distribution difference in a film thickness of the wafer to be increased and it is assumed to show a reduction in a reacting amount of silicide formation during a high temperature sputtering operation, resulting in that the sputtering under the high sputtering rate is not preferable. The sputtering power in the example of experiment 3 was set to 2.6 kW to increase a sputtering rate, resulting in that it was proved that a yield rate of the product was 98% even in the case a distance between the collimator plate and the cathode holding surface of the cathode magnet 16 was set to 50 mm.

In addition, even if it is tried to prevent deterioration in insulating withstand voltage of the gate oxidation film by increasing the sputtering rate, the metallic film of electrical conduction for shielding some charged particles against flying toward the gate just after starting the sputtering action is not formed, resulting in that as compared with the case in which the collimator plate is present, an effect of preventing deterioration of initial withstand voltage at the gate oxidation film is low.

In addition, a satisfactory result was attained even in the case of 46.5 mm under application of AMAT ENDURA of a different maker.

EXAMPLE OF EXPERIMENT 5

The present inventors used the magnetron sputtering apparatus of the preferred embodiment applied for the examples of experiment 1 and 2, set a distance $L_1$ between the cathode magnet and the collimator plate to 34 mm, a distance $L_2$ between the cathode magnet and the wafer holder to 103 mm, fixed an applied voltage to 1.5 kW, set a gas pressure to 5 mmTorr, 8 mmTorr, 10 mmTorr and 15 mmTorr, respectively, performed a Co sputtering for each of them and checked a relation between the yield rate of the gate oxidation film and a dependency on gas pressure.

As a result, it was found that the yield rate of the gate oxidation film at each of gas pressures of 5 mmTorr, 8 mmTorr, 10 mmTorr and 15 mmTorr, respectively, was 100% and the yield rate of the gate oxidation film at the magnetron sputtering apparatus has no dependency on gas.

In reference to the results of the aforesaid examples of experiment 1 to 5, it is proved that the sputtering apparatus of the preferred embodiment of the present invention is a sputtering apparatus in which the collimator plate 32 is arranged at a distance between the cathode magnet 16 and the cathode holding surface is in a range from 24 mm or more to 50 mm or less, thereby when a metal silicide film which is constitutive of metal with high melting point is formed at the gate electrode, no deterioration of insulating withstand voltage of the gate oxidation film is produced to enable the metal with high melting point to be sputtered on the polycrystalline-silicon film.

In addition, the sputtering apparatus of the preferred embodiment is set such that a dependency on sputtering electrical power, a dependency on sputtering rate and a dependency on gas pressure are low in respect to a yield of the gate oxidation film and the sputtering condition can be set in a wide range.

Effects of the Invention

As described above, in accordance with the present invention, the method for manufacturing a semiconductor device in which a metal silicide layer which is constitutive of metal with high melting point is formed between the insulating films selectively formed on the semiconductor substrate is carried out such that the metal with high melting point is accumulated in sputtering under a condition where no deterioration of the gate withstand voltage is produced, resulting in that the metal silicide layer which is constitutive of metal with high melting point is formed to enable a MOS type field effect transistor (MOSFET) producing a low resistance to be manufactured in high reliability even in the case that the gate insulating film is made thin or highly integrated and made in fine size.

In accordance with the sputtering apparatus of the present invention, the sputtering apparatus capable of sputtering metal with high melting point on a polycrystalline-silicon film is realized by a method wherein the collimator plate made of electrical conductor having many through-pass holes passed from the target toward the wafer is present between the target holder and the wafer holder while it is being connected to an earth terminal, and more preferably, the collimator plate is arranged at a spacing in respect to the target holder in a range from the first clearance $D_1$ or less to the second clearance $D_2$ or more, thereby when the metal silicide film which is constitutive of metal with high melting point is formed at the gate electrode, no deterioration of insulating withstand voltage of the gate oxidation film is produced.

In addition, the sputtering apparatus of the present invention is operated such that a dependency on sputtering electrical power, a dependency on sputtering rate and a dependency on gas pressure are low in regard to a yield rate of the gate oxidation film and the sputtering condition can be set in a wide range.

What is claimed is:

1. A method for manufacturing a semiconductor device in which metal with high melting point is accumulated on a surface of a silicon substrate formed with a polysilicon gate electrode of a semiconductor element to form a metallic film which is constitutive of metal with high melting point, thereafter the silicon substrate is heat treated to form a metal silicide layer which is constitutive of metal with high melting point at an interface layer with said metallic film which is constitutive of metal with high melting point, comprising:

accumulating, by sputtering using a magnetron sputtering apparatus, said metallic film which is constitutive of metal with high melting point, wherein, during the sputtering step, an electrical load Q reaching to said polysilicon gate electrode is less than 5 $C/cm^2$.

2. A method for manufacturing a semiconductor device according to claim 1, wherein said magnetron sputtering apparatus is constructed such that a size of a target having the metal with high melting point is set such that a plasma maximum density region is placed outside said silicon substrate and said metallic film which is constitutive of metal with high melting point is accumulated by sputtering.

3. A method for manufacturing a semiconductor device according to claim 1, wherein said magnetron sputtering apparatus is constructed such that said metal with high melting point is accumulated by sputtering under a state which a holder magnet at a side of said silicon substrate covers an entire lower surface of a wafer on which said silicon substrate is a part thereof.

4. A method for manufacturing a semiconductor device according to claim 1, wherein said magnetron sputtering apparatus is constructed such that an intensity of a holder magnet at a side of said wafer is set and said metal with high melting point is accumulated by sputtering such that a region having a maximum plasma density is positioned above a wafer on which said silicon substrate is a part thereof.

5. A method for manufacturing a semiconductor device according to claim 1, wherein said magnetron sputtering apparatus is constructed such that said metal with high melting point is accumulated by sputtering under a state in which a collimator plate of an electrical conductor is inserted into a space between a target having the metal with high melting point and a wafer on which said silicon substrate is a part thereof.

6. A method for manufacturing a semiconductor device according to claim 5, wherein said collimator plate is set with an upper surface shape thereof being net-like in structure with holes formed therethrough.

7. A method for manufacturing a semiconductor device according to claim 1, wherein said metal with high melting point is a metal selected from the group consisting of one of titanium, cobalt and nickel.

8. A method for manufacturing a semiconductor device according to claim 2, wherein said metal with high melting point is a metal selected from the group consisting of one of titanium, cobalt and nickel.

9. A method for manufacturing a semiconductor device according to claim 3, wherein said metal with high melting point is a metal selected from the group consisting of one of titanium, cobalt and nickel.

10. A method for manufacturing a semiconductor device according to claim 4, wherein said metal with high melting point is a metal selected from the group consisting of one of titanium, cobalt and nickel.

11. A method for manufacturing a semiconductor device according to claim 5, wherein said metal with high melting point is a metal selected from the group consisting of one of titanium, cobalt and nickel.

12. A method for manufacturing a semiconductor device according to claim 6, wherein said metal with high melting point is a metal selected from the group consisting of one of titanium, cobalt and nickel.

13. A method for manufacturing a semiconductor device including a transistor on a wafer, said method comprising:

forming a gate insulating layer on a semiconductor substrate;

forming a gate electrode of polysilicon on said gate insulating layer;

sputtering a high melting point metal on said gate electrode so that an electrical load amount Q reaching said gate electrode is less than another electrical load amount that is determined by a gate withstand voltage of said gate insulating layer; and annealing said high melting point metal and said gate electrode for forming silicide on said gate electrode.

14. The method as claimed in claim 13, wherein said another electrical load amount is 5 $C/cm^2$.

15. An apparatus for sputtering a high melting point metal on a polysilicon gate electrode of polysilicon formed on a gate insulating layer, said apparatus comprising:

a cathode magnet;

a target mounted on said cathode magnet;

a wafer holder;

a wafer mounted on said wafer holder; and a holder magnet generating a magnetic line of force, said magnetic line of force covering an edge of said wafer so that an electrical load amount Q reaching to said polysilicon gate electrode is less than another electrical load amount that is determined by a withstand voltage of said gate insulating layer.

16. The method as claimed in claim 15, wherein said another electrical load amount is 5 C/cm$^2$.

17. A method of manufacturing a semiconductor device comprising:

(a) selectively forming an isolation layer on a semiconductor substrate to define an active region;

(b) forming a gate electrode over said active region, said gate electrode having a top surface and side wall surfaces;

(c) introducing impurities into said active region by using said gate electrode and said isolation layer as a mask to form source and drain regions;

(d) forming an insulating layer to cover said isolation layer, said gate electrode and said source and drain regions;

(e) subjecting said insulating layer to an etching process to leave portions of said insulating layer on the side wall surfaces of said gate electrode as spacers, surfaces of said isolation layer and said source and drain regions and the top surface of said gate electrode being thereby exposed again;

(f) depositing by a sputtering apparatus a high melting point metal layer over an entire surface of said semiconductor substrate including the surfaces of said isolation layer, said source and drain regions and said spacers and the top surface of said gate electrode, said sputtering apparatus including therein an electrically conductive collimator plate, said electrically conductive collimator plate being disposed between said semiconductor substrate and a target of said high melting point metal layer so that charging-up of said gate electrode is suppressed by said electrically conductive collimator plate; and (g) performing a heat treatment such that silicide layers are formed at interfaces between said high melting point metal layer and each of said gate electrode and said source and drain regions.

18. The method as claimed in claim 17, wherein a distance between said electrically conductive collimator plate and said target is less than 50 mm and more than 24 mm.

19. The method as claimed in claim 17, wherein said electrically conductive collimator plate is grounded.

* * * * *